United States Patent [19]

Tihanyi

[11] Patent Number: 4,613,883
[45] Date of Patent: Sep. 23, 1986

[54] DYNAMIC SEMICONDUCTOR MEMORY CELL AND METHOD FOR ITS MANUFACTURE

[75] Inventor: Jenöe Tihanyi, Munich, Fed. Rep. of Germany

[73] Assignee: Siemens Aktiengesellschaft, Berlin & Munich, Fed. Rep. of Germany

[21] Appl. No.: 147,942

[22] Filed: May 8, 1980

[30] Foreign Application Priority Data

Jun. 29, 1979 [DE] Fed. Rep. of Germany ....... 2926417

[51] Int. Cl.$^4$ ............................................. H01L 29/78
[52] U.S. Cl. ................... 357/23.4; 357/23.6; 357/23.11; 357/51; 357/59; 365/149; 365/182
[58] Field of Search .............. 357/23, 59, 51; 365/149, 182

[56] References Cited

U.S. PATENT DOCUMENTS

| | | | |
|---|---|---|---|
| 3,893,146 | 7/1975 | Heeren | 357/23 |
| 3,950,777 | 4/1976 | Tarui et al. | 357/23 |
| 4,007,478 | 2/1977 | Yagi | 357/23 |
| 4,014,036 | 3/1977 | Ho et al. | 357/23 |
| 4,091,405 | 5/1978 | Ishida | 357/23 |
| 4,190,850 | 2/1980 | Tihanyi et al. | 357/23 |
| 4,240,092 | 12/1980 | Kuo | 357/23 |
| 4,255,756 | 3/1981 | Shimotori et al. | 357/23 |
| 4,280,855 | 7/1981 | Bertin et al. | 357/23 |
| 4,290,186 | 9/1981 | Klein et al. | 357/23 |
| 4,317,273 | 3/1982 | Gutterman et al. | 357/23 |
| 4,319,342 | 3/1982 | Scheuerlein | 357/23 |

FOREIGN PATENT DOCUMENTS 52-38841 3/1977 Japan ................. 357/23 VD
54-22785 2/1979 Japan ................. 357/23 C

OTHER PUBLICATIONS

K. Shimotori et al., "Fully Ion Implanted 4096-Bit H.S. DSA MOS RAM," 1977 IEEE ISSCC Conf. Proc., Feb. 16, 1977, pp. 76-77, 240.

I. Ohkura et al., "Fully Ion Implanted OSA MOS IC," Jap. J. of Appl. Phys., vol. 16, Suppl. 16-1, 1977, pp. 167-171.

Primary Examiner—Joseph E. Clawson, Jr.
Attorney, Agent, or Firm—Hill, Van Santen, Steadman & Simpson

[57] ABSTRACT

A dynamic semiconductor memory cell has a field effect transistor and a memory capacitor formed on a semiconductor body. In addition to a first zone, doped oppositely with respect to the doping of the semiconductor body, further zones are formed parallel to the boundary surface of the body and doped with the same conductivity of the semiconductor body, but to a higher degree. The further zones lie below regions at the boundary surface which are doped opposite to the semiconductor body. The further zones include edge portions which extend up to the boundary surface and which limit the regions thereabove in the lateral direction. A gate is provided and in an area of the semiconductor body beneath the gate and adjacent to the boundary surface a region is provided, doped opposite to the semiconductor body and connecting the edge portions. The edge portions, at the boundary surface, form a two-part channel area of the field effect transistor.

10 Claims, 2 Drawing Figures

DYNAMIC SEMICONDUCTOR MEMORY CELL AND METHOD FOR ITS MANUFACTURE

CROSS REFERENCE TO RELATED APPLICATION

This application is related to application Ser. No. 147,943, filed May 8, 1980.

BACKGROUND OF THE INVENTION

1. Field of the Invention

The present invention relates to a dynamic semiconductor memory cell having a field effect transistor which has a gate applied insulated to the boundary surface of a semiconductor body and two regions oppositely doped with respect to a basic doping of the semiconductor body, and a memory capacitor which likewise exhibits an oppositely doped first zone of the semiconductor body adjacent to the boundary surface and an electrode applied insulated to the boundary surface, in which the one region is connected to a bit line and the other is connected to the first zone, and to a method for manufacturing the same.

2. Description of the Prior Art

Memory cells of the type mentioned above are described, for example, in U.S. Pat. No. 3,533,089. In order to achieve greater and greater integration densities, there is an attempt in semiconductor memory technology to place the individual memory cells on as small as possible a semiconductor surface.

SUMMARY OF THE INVENTION

The object of the present invention is to provide semiconductor memory cells having a small packing density.

The above object is achieved, according to the present invention, in that further zones are provided essentially parallel to the boundary surface and doped in the same conductivity with respect to the basic doping but exhibiting a higher degree of doping. The further zones lie below the two regions mentioned above and adjacent thereto. Edge areas of the further zones lie under the gate and extend up to the boundary surface so that they limit the regions in the lateral direction. Beneath the gate an area of the semiconductor body adjacent to the boundary surface and connecting the edge areas is provided with a doping opposite to the basic doping. The parts of the edge areas lying at the boundary surface form a two-part channel area of the field effect transistor.

The advantage which can be achieved with the present invention, in particular, is that the cell structure requires a significantly smaller semiconductor surface for the field effect transistor than is the case in the traditional single-transistor memory cell. This is attributed to the fact that the gate of the field effect transistor can be executed with technologically conditioned minimum dimensions, whereby the transistor channel covered by the gate still exhibits a significantly smaller length. Therefore, the field effect transistor, with respect to its partial voltage, is largely independent of fluctuations of the substrate bias voltage. Further, the capacity of the memory capacitor is greater with respect to a prescribed semiconductor surface than in the traditional memory cell. This increase of capacity plays an even greater role in the further development of the invention in which one of the regions, connectible to a bit line by way of the channel area, and the further zone line thereunder are dimensioned in the lateral direction in such a manner that they also extend to the area of the memory capacitor.

The region connected to the bit line is connected to an additional region oppositely doped with respect to the basic doping; the additional oppositely doped region is connected to an oppositely doped strip-like semiconductor zone provided in the semiconductor body and serving as the bit line; the additional oppositely doped semiconductor region is contacted with an electrically conductive coating in the area of an electrically insulating layer, the electrically conductive coating being connected to a bit line; the bit line is executed as a metallic path which is laid on an insulating layer which covers the semiconductor memory cell and contacts the electrically conductive coating in the area of a further contact hole; the semiconductor body is provided with a terminal lying at a fixed voltage and an electrode of the memory capacitor is connected to a predetermined potential by way of a terminal; and the semiconductor body consists of doped silicon and the gate and/or the electrode of the memory capacitor and/or the coating contacting the additional region are formed of highly doped, polycrystalline silicon. The provision of the additional, oppositely doped semiconductor region contacted with an electrically conductive coating in the area of a contact hole of the electrically conducting layer, the electrically conductive coating being in turn connected to a bit line, and the execution of the bit line as a metallic path which is laid on another insulating layer covering the semiconductor memory cell and contacting the electrically conductive coating in the area of a further contact hole guarantees very small bit line capacities.

Particularly favorable manufacturing methods, according to the present invention, are also set forth herein and are particularly characterized in that a semiconductor body provided with a basic doping is covered at its boundary surface with an electrically insulating layer which exhibits a thin layer area and a thick layer area surrounding the thin layer area. The semiconductor body is provided with a doping zone at the boundary surface below the thin area which exhibits a doping opposite to that of the basic doping. An opening is provided in the thin area under which the additional region which has a doping opposite to the basic doping is generated. A gate and the electrode of the memory capacitor are placed on the insulating layer. A first mask is provided which essentially only leaves the gate and the two regions adjacent to the gate serving as source and drain regions of the field effect transistor exposed. A first doping step with a doping substance corresponding to the basic doping is undertaken to generate the further zones lying beneath the latter-mentioned regions. For forming these regions, a second doping step occurs with a doping substance which generates a doping opposite to the basic doping.

In addition to the gate and the electrode, a coating contacting the additional region is also placed on the electrically insulating layer. The partial structure created after the two doping steps is covered with a further, electrically insulating layer and a conductive path is laid thereon, the path in turn contacting the coating with a contact hole provided in the further electrically insulating layer.

BRIEF DESCRIPTION OF THE DRAWING

Other objects, features and advantages of the invention will be best understood from the following detailed description, taken in conjunction with the accompanying drawing, on which.

DESCRIPTION OF THE PREFERRED EMBODIMENTS

Figure 1:
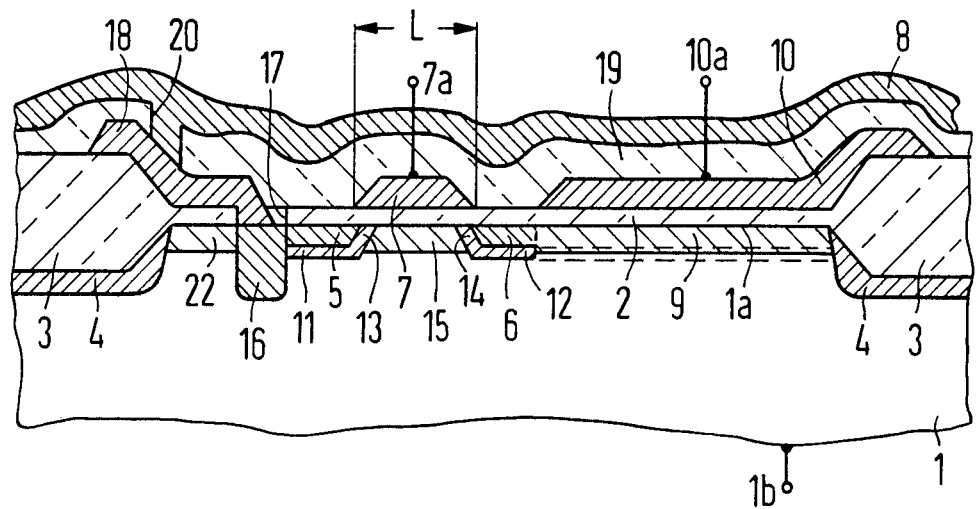
FIG. 1 is a cross sectional view taken through an exemplary embodiment of the invention.

In FIG. 1, a body consisting of semiconductive material, for example, of p-doped silicon, is referenced 1. Its boundary surface 1a is covered with an electrically insulating layer which exhibits an area 2 having a thinner layer thickness. For the case in which the insulating layer is $SiO_2$, the area 2 is also designated as a gate oxide layer. Areas 3 of the electrically insulating layer are adjacent to the area 2, the areas 3 being executed with a significantly greater layer thickness and which, in the case under consideration, are also designated as field oxide layers. Semiconductor areas 4 which are $p^+$-doped and encompass the area of the memory cell therebetween are provided beneath the field oxide areas 3.

Two $n^+$-doped areas 5 and 6 adjacent to the boundary surface 1a, as well as a gate 7, arranged on the gate oxide layer 2, are component parts of a field effect transistor which represents the selection element of the memory cell. The area 5 is connected, in a manner to be described in greater detail below, to a bit line 8 by way of which a binary information to be stored is inscribed in the memory cell or, respectively, read therefrom. The area 6 is connected to a n-doped zone 9 of the semiconductor body 1 which is adjacent to the boundary surface 1a and which represents an electrode of a memory capacitor and which extends to the lateral limit of the memory cell given by the area 4. The second electrode of the memory capacitor is formed by an electrically conductive coating 10 which is arranged on the gate oxide layer 2 and, partially, on the field oxide layer 3. The gate 7 is connected to a word line by way of which the memory cell can be selected, whereas the electrode 10 is connected to a fixed voltage. In particular, the gate 7 and the electrode 10 consists of parts of electrically conductive coatings which are designed as strips and which extend perpendicularly to the plane of the drawing in FIG. 1, the coatings being shared, in common, by a group of memory cells lying behind one another. The gate 7 and the electrode 10 are formed with particular advantage of highly doped, polycrystalline silicon.

Beneath the areas 5 and 6 are zones 11 and 12 which are adjacent to the areas 5 and 6 and which are doped in the same direction with respect to the basic doping of the semiconductor body 1, but which exhibit a higher degree of doping i.e. $p^+$-doping. Edge areas 13 and 14 of these zones, lying below the gate 7, extend up to the boundary surface 1a, so that they limit the areas 5, 6 in the lateral direction. A n-doped area 15 adjacent to the boundary surface 1a and connecting the edge areas 13 and 14 to one another is further situated below the gate 7. If one applies a voltage exceeding the threshold voltage of the field effect transistor to the gate 7 by way of a terminal 7a, then inversion layers which represent a two-part channel area of the field effect transistor are formed in the edge areas 13 and 14 adjacent to the boundary surface 1a.

An additional, n-doped area 16 extends up to the boundary surface 1a and is connected to the area 5. In the area of the additional region 16, the gate oxide layer 2 has a contact hole 17 in which an electrically conductive coating 18, which is partially arranged above the field oxide layer 3, contacts the additional region 16. A further insulating layer 19 covering the parts 7, 10 and 18 and preferably likewise consisting of $SiO_2$ has a contact hole 20 above the coating 18, in which hole a bit line 8, executed as a metallic path and laid on the insulation layer 19, in turn contacts the coating 18.

Expediently, the gate 7 is executed in such a manner that it exhibits a length L which corresponds to a technologically conditioned minimum dimension of, for example, 1 $\mu$m. Each part of the transistor channel lying within the edge regions 13 or, respectively 14, then exhibits a length which corresponds to only a fraction of this dimension, therefore, for example, 0.2–0.3 $\mu$m. Such lateral dimensions give rise to the fact that the semiconductor surface required for the field effect transistor is kept extremely small. On the other hand, by doing so, a high degree of independence of the threshold voltage of the field effect transistor from fluctuations of a negative substrate bias voltage applied by way of a terminal 1b is also achieved. A depletion layer capacitance exists at the boundary surface between the region 6 and the zone 12, the depletion layer capacitance being connected parallel to the memory capacitor formed by the elements 9 and 10 and, therefore, increasing the storage capacity of the entire cell.

In operation, one proceeds in such a manner for writing a binary information into the memory cell that the gate 7 or, respectively, the word line connected to the gate 7 is connected to a gate voltage lying above the threshold voltage of the field effect transistor by way of the terminal 7a. By doing so, the parts of the edge regions 13 and 14 lying at the boundary surface 1a invert, so that two n-conductive channel parts connected to one another by the region 15 arise. This produces a conductive connection between the region 5 connected to the bit line 8 and the region 6 connected to the zone 9. Depending on the binary information to be written, the bit line 8 lies at a low or high positive potential, whereas the electrode 10 has a constant positive potential applied thereto by way of a terminal 10a. Given a bit line 8 lying at a low potential, charge carriers then proceed from the region 5 into the memory capacitor formed of the elements 9, 10 and 6, 12 and accordingly charge the same. When reading the stored information, a high potential is applied to the bit line 8 and when the same is disconnected from external potentials, i.e. when the bit line 8 is brought in a state which is designated as "floating", then, given the conductive transistor channel 13, 14, a flow back occurs and generates a potential drop on the bit line 8, which potential drop is evaluated by a reading unit connected thereto. The read signal is all the greater the smaller the capacitance of the bit line 8 with respect to the substrate 1 at bias voltage. In the embodiment of the memory cell illustrated in FIG. 1, in which the bit line 8 is connected to the region 5 of the field effect transistor by way of the conductive coating 18 and the additional region 16, a very small bit line capacitance arises.

According another embodiment of the invention, the additional region 16 in FIG. 1 can represent a part of a strip-like semiconductor region which forms the bit line at the same time. In this case, the line 8 can be viewed as a word line which then contacts the gate 7 through a contact hole (not illustrated) of the insulating layer 19. In this embodiment, however, the bit line capacitance is greater than in the embodiment specifically illustrated in FIG. 1, so that the signal read from the cell is smaller.

In a further embodiment of a memory cell constructed in accordance with the present invention, the conductive coating 18 which contacts the additional region 16 can consist of a part of a strip-like conductive coating which serves as a bit line. Such an embodiment, in which the line 8 is again to be viewed as a word line contacting the gate 7, lies between the two embodiments described above, both in terms of the structural outlay and the size of the signal read therefrom.

According to a preferred further development of the invention, the region 6 illustrated in FIG. 1, as well as the zone 12 lying below the region 6 are enlarged in the lateral direction until they extend to the limits of the parts 6 and 12 extended in the manner illustrated in FIG. 1 with broken lines, whereby the boundary surface between the elements 1 and 9 indicated by a solid line in FIG. 1 is omitted. By doing so, a significantly greater depletion layer capacitance arises between the elements 6 and 12, by means of which the memory capacitance of the memory cell is significantly increased. This means an increase of the signal read therefrom, given the same outlay for semiconductor surface, or means the achievement of the same signal with a significantly reduced surface.

In FIG. 1, a n-doped region 22 is indicated to the left of the region 16, the region 22 representing a part of a doping zone encompassing the entire cell area between the doped areas 4 adjacent to the boundary surface $1a$, whereby the region 15 and the zone 9 are to be viewed as further portions of this doping zone. In the course of the manufacturing process, the elements 15, 9 and 22 separated from one another arise from this doping zone by means of the insertion of the regions 5, 6, 11, 12, 13, 14 and 16.

Figure 2:
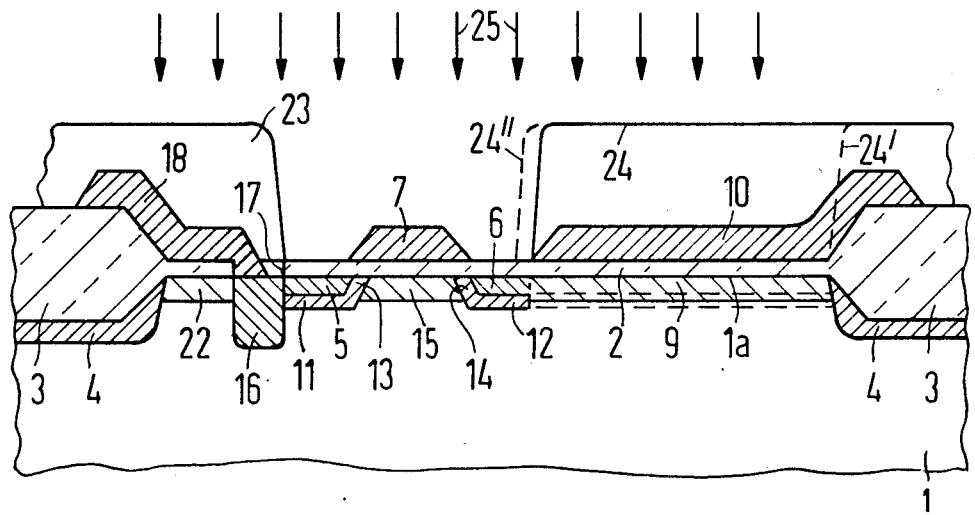
FIG. 2 is a partial structure of FIG. 1 which arises during a preferred method of manufacturing the same.

In the manufacture of the memory cell of the present invention, one preferably proceeds in such a manner that, first, a p-doped semiconductor body 1 is provided with a $p^+$-doped region 4 at its boundary surface $1a$ which encloses the cell area. Subsequently, this boundary surface is covered with an electrically insulating layer which increases beyond the cell area to a layer thickness 3, whereas it forms a thin layer area 2 within the cell area. Subsequently, a n-conductive doping zone adjacent to the boundary surface $1a$ is provided which is limited in its lateral direction by the regions 4. Individual portions of this doping zone are provided with the reference symbols 22, 15 and 9 in FIG. 2. This is followed by a masking step which defines the position of the additional n-conductive region 16 and by diffusion or ion implantation operation generating this region. Subsequently, a contact hole 17 is provided in the thin layer area 2 and a coating of the insulating layer 2, 3 with a layer of highly-doped polycrystalline silicon is undertaken. The structures 18, 7 and 10 are defined from this layer with the assistance of photolithographic steps known per se. Thereby, a plasma etching method is preferably employed in the removal of the superfluous layer portions such as is described, for example, by Bell in the *Proceedings of the International Conference on Microlithography*, Paris 1977, pp. 339–342, in order to obtain the sloping edges of the structures retained, as is illustrated in FIG. 2. The structure 18 then represents a coating contacting the region 16; the structure 7 forms the gate of the field effect transistor; and the structure 10 forms the external electrode of the memory capacitor.

In a further method step, a mask 23, 24 consisting, for example, of photosensitive resist is formed which, according to FIG. 2, leaves the cell area exposed approximately from the right-hand edge of the contact hole 17 up to the left-hand sloped edge of the electrode 10. By a first ion implantation, which is indicated by the arrows 25, ions of a doping substance effecting a positive conductivity are now incorporated with such energy that $p^+$-doped regions 11 and 12 now arise lying deeply in the semiconductor areas which are only covered by the thin insulating layer area 2. The sloping edges of the gate 7 cause the edge areas 13 and 14 of these regions to arise therebeneath, extending up to the boundary surface $1a$. A second ion implantation follows in which ions of doping substances which produce a negative conductivity in the semiconductor body 1 are incorporated in the direction of the arrows 25. In so doing, however, a lower acceleration energy is exerted, so that the $n^+$-doped regions 5 and 6 lying at the boundary surface $1a$ arise. The parts of the semiconductor body 1 covered by the mask 23, 24 are not influenced by the ion implantations. Likewise, the semiconductor region lying beneath the gate 7, if one ignores the sloping edge zones of the gate, are not influenced by the ion implantations.

If one designs the mask portion 24 in such a manner that it exhibits an edge 24' which approximately coincides with the edge of the thicker layer area 3, and if the implantation operations are executed in the manner described above, whereby the electrode 10 is applied with photolithographic method steps known per se only after the implantations, then the areas 6 and 12 arise which are extended up to the mask edge 24', as indicated in FIG. 2 with broken lines.

After removal of the mask 23, 24, the cell structure then existing is coated with the electrically insulating layer 19 on which, after the application of the contact hole 20, the bit line 8 is applied, the bit line 8 consisting, for example, of an aluminum path.

The following example of doping, in which one proceeds with a silicon body 1 doped with $5 \times 10^{14}$ cm$^{-3}$ acceptors, for example, boron atoms, can serve for further explanation of the invention. The regions 4 exhibit a dose of 5 through $10 \times 10^{11}$ cm$^{-2}$ acceptors; the regions 22, 15 and 9 are doped with donors, for example, phosphorous atoms, namely with a dose of 5 through $10 \times 10^{11}$ cm$^{-2}$. The doping of the regions 16 and of the regions 5 and 6 occurs approximately with a dose of 1 through $10 \times 10^{14}$ cm$^{-2}$ for example, arsenic atoms, whereas the zones 11, 13 and 12, 14 are doped with a dose of 2 through $3 \times 10^{12}$ cm$^{-2}$ acceptors, for example, boron atoms. For the implantation of the acceptor ions generating the zones 11, 13 and 12, 14, an acceleration energy of approximately 150 keV is employed, while an energy of approximately 140 keV is employed for incorporating the donor ions generating the regions 5 and 6.

The latter data relate to an exemplary embodiment in which the regions 5 and 6 respectively exhibit a thickness of 0.1 $\mu$m measured perpendicular to the boundary surface $1a$, whereas the zones 11 and 12 are executed with a thickness of 0.3 $\mu$m. As concerns the further structural dimensions, the thickness of the elements 7, 10 and 18 amounts to approximately 0.4–0.7 $\mu$m and the thickness of the layer 2 amounts to approximately 50 nm. The insulating layer 19 exhibits a thickness of approximately 1 μm.

In another advantageous method for manufacturing the memory cell of the present invention, the regions 5 and 6, as well as the zones 11–14, are not generated by means of implantation steps, but, rather, by means of diffusion steps. Thereby, the edges of the gate 7 can also extend in a vertical direction. This method is particularly suited for the manufacture of a memory cell in which the region 7, and the zone 12 also extend to the area of the memory capacitor. The mask portion 24 then again has the edge 24', whereas the electrode 10 is applied by means of photolithographic steps known per se only after the diffusion operations. A first diffusion of acceptor atoms generates the zones 11–14, whereas a subsequent diffusion with donor atoms generates the regions 5 and 6. The thickness of the zones 11–14 is set by means of different diffusion times in the two diffusion operations, which is known per se from DMOS technology.

If one employs the latter method for the manufacture of memory cells according to the present invention in which the region 6 and the zone 12 do not extend to the memory area, then the electrode 10 is applied before the diffusion operations. So that, however, the zone 12 does not receive a second edge area at its boundary to the zone 9 extending up to the boundary surface 1a, which would interfere with the operation of the memory cell, it is necessary to undertake the first diffusion with acceptor atoms with a mask 24 which has a front edge 24". The second diffusion with donor atoms then occurs with a mask 24 whose front edge is illustrated in FIG. 2 with a solid line.

The memory cell according to the present invention, of course, can also be constructed on a n-doped silicon body 1, whereby the dopings are changed in such a manner that conductivity respectively opposite to those described up to now are employed. In this case, the bit line 8 and the terminal 7a and 10a receive negative voltages, whereas a positive bias voltage is applied to the terminal 1b.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A dynamic semiconductor memory cell comprising:
   a semiconductor body doped to a first conductivity and including a surface;
   first and second regions in said semiconductor body at said surface and doped to an opposite, second conductivity;
   a memory capacitor including a doped zone of the second conductivity in said semiconductor body and an electrode carried by and insulated from said surface;
   a pair of zones extending generally parallel to said surface in said semiconductor body and having a higher degree of said first conductivity than said semiconductor body, said zones lying below respective ones of said first and second regions and including edge portions extending up to said surface to limit the respective regions in the lateral direction;
   a gate carried by and insulated from said surface; and
   a zone of said semiconductor body lying beneath said gate connecting said edge portions and having said second conductivity,
   parts of said edge portions lying at said surface forming a two-part channel area of a field effect transistor.

2. The memory cell of claim 1, wherein:
   one of said regions and the respective zone thereunder extend laterally to said memory capacitor.

3. The memory cell of claim 2, and further comprising:
   a strip-shaped semiconductor zone, oppositely doped in relation to the semiconductor body, in said body as a bit line; and
   an additional zone of the second conductivity adjacent and connected to the other of said regions and connected to said bit line formed by the strip-shaped semiconductor zone.

4. The memory cell of claim 2, and further comprising:
   a bit line insulated from and carried by said semiconductor body; and
   an additional zone of the second conductivity adjacent and connected to the other of said regions and connected to said bit line.

5. The memory cell of claim 4, and further comprising:
   an insulating layer carrying said bit line, said bit line comprising a metallic path;
   a contact hole through said insulating layer; and
   a conductive layer contacting said bit line through said hole and contacting said additional zone.

6. The memory cell of claim 4, and further comprising:
   a first insulating layer carried by said semiconductor body and including a first contact hole therethrough;
   a conductive layer carried on said first insulating layer and contacting said addtional zone through said first contact hole;
   a second insulating layer covering said conductive layer and including a second contact hole therethrough, said bit line contacting said conductive layer through said second contact hole.

7. The memory cell of claim 6, and further comprising:
   an electrode carried by and contacting said semiconductor body for connection to a fixed voltage, and wherein said memory capacitor electrode includes a terminal for connection to a predetermined potential.

8. The memory cell of claim 6, wherein:
   said semiconductor body comprises silicon; and
   said gate comprises polycrystalline silicon.

9. The memory cell of claim 6, wherein:
   said semiconductor body comprises silicon; and
   said memory capacitor electrode comprises polycrystalline silicon.

10. The memory cell of claim 6, wherein:
    said semiconductor body comprises silicon; and
    said conductive layer comprises polycrystalline silicon.

* * * * *